(12) United States Patent
Paek et al.

(10) Patent No.: US 9,391,043 B2
(45) Date of Patent: Jul. 12, 2016

(54) SEMICONDUCTOR DEVICE AND MANUFACTURING METHOD THEREOF

(71) Applicant: Amkor Technology, Inc., Tempe, AZ (US)

(72) Inventors: Jong Sik Paek, Seongnam-si (KR); Won Chul Do, Bucheon-si (KR); Doo Hyun Park, Seongnam-si (KR); Eun Ho Park, Seoul (KR); Sung Jae Oh, Seoul (KR)

(73) Assignee: AMKOR TECHNOLOGY, INC.

( * ) Notice: Subject to any disclaimer, the term of this patent is extended or adjusted under 35 U.S.C. 154(b) by 0 days.

(21) Appl. No.: 14/719,539

(22) Filed: May 22, 2015

(65) Prior Publication Data

US 2015/0255422 A1 Sep. 10, 2015

Related U.S. Application Data

(63) Continuation of application No. 13/863,457, filed on Apr. 16, 2013, now Pat. No. 9,048,125.

(30) Foreign Application Priority Data

Nov. 20, 2012 (KR) ........................ 10-2012-0131967

(51) Int. Cl.
*H01L 21/56* (2006.01)
*H01L 23/00* (2006.01)
(Continued)

(52) U.S. Cl.
CPC ............ *H01L 24/81* (2013.01); *H01L 21/4853* (2013.01); *H01L 21/563* (2013.01);
(Continued)

(58) Field of Classification Search
CPC ................ H01L 21/568; H01L 21/563; H01L 23/49822; H01L 2224/73204; H01L 2224/97
See application file for complete search history.

(56) References Cited

U.S. PATENT DOCUMENTS

| 3,462,349 A | 8/1969 | Gorgenyi |
| 3,868,724 A | 2/1975 | Perrino |

(Continued)

FOREIGN PATENT DOCUMENTS

| JP | 05-109975 | 4/1993 |
| JP | 05-136323 | 6/1993 |

(Continued)

OTHER PUBLICATIONS

Office Action corresponding to Korean Patent Application No. 10-2012-0061321, 5 pages, Jun. 13, 2013.

(Continued)

*Primary Examiner* — John C Ingham
(74) *Attorney, Agent, or Firm* — McAndrews, Held & Malloy, Ltd.

(57) ABSTRACT

A semiconductor device including a relatively thin interposer excluding a through silicon hole and a manufacturing method thereof are provided. The method includes forming an interposer on a dummy substrate. The forming of the interposer includes, forming a dielectric layer on the dummy substrate, forming a pattern and a via on the dielectric layer, and forming a seed layer at the pattern and the via of the dielectric layer and forming a redistribution layer and a conductive via on the seed layer. A semiconductor die is connected with the conductive via facing an upper portion of the interposer, and the semiconductor die is encapsulated with an encapsulant. The dummy substrate is removed from the interposer. A bump is connected with the conductive via facing a lower portion of the interposer.

20 Claims, 12 Drawing Sheets

(51) Int. Cl.
*H01L 21/683* (2006.01)
*H01L 23/498* (2006.01)
*H01L 21/48* (2006.01)
*H01L 21/768* (2006.01)
*H01L 23/31* (2006.01)

(52) U.S. Cl.
CPC ...... *H01L21/6835* (2013.01); *H01L 21/76805* (2013.01); *H01L 23/3157* (2013.01); *H01L 23/49816* (2013.01); *H01L 23/49827* (2013.01); *H01L 23/49838* (2013.01); *H01L 24/03* (2013.01); *H01L 24/08* (2013.01); *H01L 24/10* (2013.01); *H01L 24/11* (2013.01); *H01L 24/17* (2013.01); *H01L 24/97* (2013.01); *H01L 24/13* (2013.01); *H01L 24/16* (2013.01); *H01L 2221/68345* (2013.01); *H01L 2221/68381* (2013.01); *H01L 2224/0231* (2013.01); *H01L 2224/0233* (2013.01); *H01L 2224/02372* (2013.01); *H01L 2224/0401* (2013.01); *H01L 2224/131* (2013.01); *H01L 2224/13024* (2013.01); *H01L 2224/13082* (2013.01); *H01L 2224/13147* (2013.01); *H01L 2224/16113* (2013.01); *H01L 2224/16225* (2013.01); *H01L 2224/16227* (2013.01); *H01L 2224/16235* (2013.01); *H01L 2224/2929* (2013.01); *H01L 2224/29299* (2013.01); *H01L 2224/32225* (2013.01); *H01L 2224/32245* (2013.01); *H01L 2224/33181* (2013.01); *H01L 2224/73204* (2013.01); *H01L 2224/73253* (2013.01); *H01L 2224/81005* (2013.01); *H01L 2224/81193* (2013.01); *H01L 2924/12042* (2013.01); *H01L 2924/15311* (2013.01); *H01L 2924/15788* (2013.01); *H01L 2924/164* (2013.01); *H01L 2924/16152* (2013.01); *H01L 2924/19105* (2013.01)

(56) References Cited

U.S. PATENT DOCUMENTS

| | | |
|---|---|---|
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | Maciver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Ojennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,841,193 A | 11/1998 | Eichelberger |
| 5,847,453 A | 12/1998 | Uematsu et al. |
| 5,883,425 A | 3/1999 | Kobayashi |
| 5,894,108 A | 4/1999 | Mostafazadeh et al. |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,051,888 A | 4/2000 | Dahl |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,137,062 A | 10/2000 | Zimmerman |
| 6,157,080 A | 12/2000 | Tamaki et al. |
| 6,159,767 A | 12/2000 | Eichelberger |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Pan chou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,294,408 B1 | 9/2001 | Edwards et al. |
| 6,307,161 B1 | 10/2001 | Grube et al. |
| 6,316,285 B1 | 11/2001 | Jiang et al. |
| 6,329,609 B1 | 12/2001 | Kaja et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |

(56) References Cited

U.S. PATENT DOCUMENTS

| | | |
|---|---|---|
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,486,005 B1 | 11/2002 | Kim |
| 6,486,554 B2 | 11/2002 | Johnson |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,573,598 B2 | 6/2003 | Ohuchi et al. |
| 6,577,013 B1 | 6/2003 | Glenn et al. |
| 6,586,682 B2 | 7/2003 | Strandberg |
| 6,608,382 B2 | 8/2003 | Liu et al. |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,576 B2 | 4/2004 | Hedler |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,765,287 B1 | 7/2004 | Lin |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leale et al. |
| 6,845,554 B2 | 1/2005 | Frankowsky et al. |
| 6,888,240 B2 | 5/2005 | Towle et al. |
| 6,905,914 B1 | 6/2005 | Huemoeller et al. |
| 6,919,514 B2 | 7/2005 | Konrad et al. |
| 6,921,968 B2 | 7/2005 | Chung |
| 6,921,975 B2 | 7/2005 | Leale et al. |
| 6,931,726 B2 | 8/2005 | Boyko et al. |
| 6,943,436 B2 | 9/2005 | Radu et al. |
| 6,953,995 B2 | 10/2005 | Farnworth et al. |
| 6,967,403 B2 | 11/2005 | Chuang et al. |
| 6,982,225 B2 | 1/2006 | Bohr |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,112,882 B2 | 9/2006 | Lee |
| 7,119,432 B2 | 10/2006 | Desai et al. |
| 7,125,744 B2 | 10/2006 | Takehara et al. |
| 7,185,426 B1 | 3/2007 | Hiner et al. |
| 7,192,807 B1 | 3/2007 | Huemoeller et al. |
| 7,196,408 B2 | 3/2007 | Yang et al. |
| 7,198,980 B2 | 4/2007 | Jiang et al. |
| 7,202,107 B2 | 4/2007 | Fuergut et al. |
| 7,215,026 B2 | 5/2007 | Park et al. |
| 7,238,602 B2 | 7/2007 | Yang |
| 7,242,081 B1 | 7/2007 | Lee |
| 7,247,523 B1 | 7/2007 | Huemoeller et al. |
| 7,262,081 B2 | 8/2007 | Yang et al. |
| 7,262,082 B1 | 8/2007 | Lin et al. |
| 7,282,394 B2 | 10/2007 | Cho et al. |
| 7,285,855 B2 | 10/2007 | Foong |
| 7,326,592 B2 | 2/2008 | Meyer et al. |
| 7,339,279 B2 | 3/2008 | Yang |
| 7,345,361 B2 | 3/2008 | Mallik et al. |
| 7,361,987 B2 | 4/2008 | Leal |
| 7,372,151 B1 | 5/2008 | Fan et al. |
| 7,405,102 B2 | 7/2008 | Lee et al. |
| 7,420,272 B1 | 9/2008 | Huemoeller et al. |
| 7,429,786 B2 | 9/2008 | Karnezos et al. |
| 7,459,202 B2 | 12/2008 | Magera et al. |
| 7,459,781 B2 | 12/2008 | Yang et al. |
| 7,548,430 B1 | 6/2009 | Huemoeller et al. |
| 7,550,857 B1 | 6/2009 | Longo et al. |
| 7,623,733 B2 | 11/2009 | Hirosawa |
| 7,633,765 B1 | 12/2009 | Scanlan et al. |
| 7,642,133 B2 | 1/2010 | Wu et al. |
| 7,671,457 B1 | 3/2010 | Hiner et al. |
| 7,675,131 B2 | 3/2010 | Derderian |
| 7,750,454 B2 | 7/2010 | Carson et al. |
| 7,777,351 B1 | 8/2010 | Berry et al. |
| 7,781,883 B2 | 8/2010 | Sri-Jayantha et al. |
| 7,825,520 B1 | 11/2010 | Longo et al. |
| 7,902,660 B1 | 3/2011 | Lee et al. |
| 7,928,562 B2 | 4/2011 | Arvelo et al. |
| 7,948,095 B2 | 5/2011 | Ng et al. |
| 7,960,827 B1 | 6/2011 | Miller et al. |
| 7,982,298 B1 | 7/2011 | Kang et al. |
| 7,993,983 B1 | 8/2011 | Lin |
| 8,003,515 B2 | 8/2011 | Meyer et al. |
| 8,004,095 B2 | 8/2011 | Shim et al. |
| 8,008,770 B2 | 8/2011 | Lin et al. |
| 8,035,123 B2 | 10/2011 | Yan et al. |
| 8,058,726 B1 | 11/2011 | Jin et al. |
| 8,067,268 B2 | 11/2011 | Carson et al. |
| 8,106,500 B2 | 1/2012 | Chow |
| 8,222,538 B1 | 7/2012 | Yoshida et al. |
| 8,258,015 B2 | 9/2012 | Chow et al. |
| 8,269,348 B2 | 9/2012 | Fazelpour |
| 8,288,201 B2 | 10/2012 | Pagaila |
| 8,341,835 B1 | 1/2013 | Huemoeller et al. |
| 8,471,154 B1 | 6/2013 | Yoshida et al. |
| 8,471,376 B1 | 6/2013 | Liou et al. |
| 8,471,394 B2 | 6/2013 | Jang et al. |
| 8,508,954 B2 | 8/2013 | Kwon et al. |
| 8,536,462 B1 | 9/2013 | Darveaux et al. |
| 8,552,556 B1 | 10/2013 | Kim et al. |
| 8,604,615 B2 | 12/2013 | Lee et al. |
| 8,624,374 B2 | 1/2014 | Ding et al. |
| 8,643,163 B2 | 2/2014 | Shim et al. |
| 8,674,513 B2 | 3/2014 | Yu et al. |
| 8,759,147 B2 | 6/2014 | Choi et al. |
| 8,773,866 B2 | 7/2014 | Jin et al. |
| 8,829,678 B2 | 9/2014 | Lee et al. |
| 8,946,883 B2 | 2/2015 | Kim et al. |
| 8,981,550 B2 | 3/2015 | Park et al. |
| 9,000,586 B2 | 4/2015 | Do et al. |
| 9,012,789 B1 | 4/2015 | Yoshida et al. |
| 9,048,125 B2 | 6/2015 | Paek et al. |
| 9,064,718 B1 | 6/2015 | Muniandy et al. |
| 2002/0011657 A1 | 1/2002 | Saito |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0135057 A1 | 9/2002 | Kurita |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0141582 A1 | 7/2003 | Yang et al. |
| 2003/0197284 A1 | 10/2003 | Khiang et al. |
| 2004/0036183 A1 | 2/2004 | Im et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2004/0165362 A1 | 8/2004 | Farnworth |
| 2004/0262774 A1 | 12/2004 | Kang et al. |
| 2005/0056928 A1 | 3/2005 | Kwon et al. |
| 2005/0062154 A1 | 3/2005 | Duchesne et al. |
| 2005/0133928 A1 | 6/2005 | Howard et al. |
| 2005/0133932 A1 | 6/2005 | Pohl et al. |
| 2005/0134507 A1 | 6/2005 | Dishongh et al. |
| 2005/0139985 A1 | 6/2005 | Takahashi |
| 2005/0242425 A1 | 11/2005 | Leal et al. |
| 2006/0192301 A1 | 8/2006 | Leal et al. |
| 2006/0208351 A1 | 9/2006 | Poo et al. |
| 2006/0231958 A1 | 10/2006 | Yang |
| 2006/0258044 A1 | 11/2006 | Meyer et al. |
| 2007/0059866 A1 | 3/2007 | Yang et al. |
| 2007/0064395 A1 | 3/2007 | Chen et al. |
| 2007/0069389 A1 | 3/2007 | Wollanke et al. |
| 2007/0080757 A1 | 4/2007 | Yahata et al. |
| 2007/0126085 A1 | 6/2007 | Kawano et al. |
| 2007/0132104 A1 | 6/2007 | Farnworth et al. |
| 2007/0273049 A1 | 11/2007 | Khan et al. |

(56) References Cited

U.S. PATENT DOCUMENTS

| | | | |
|---|---|---|---|
| 2007/0281471 A1 | 12/2007 | Hurwitz et al. |
| 2007/0287265 A1 | 12/2007 | Hatano et al. |
| 2007/0290376 A1 | 12/2007 | Zhao et al. |
| 2008/0105967 A1 | 5/2008 | Yang et al. |
| 2008/0128884 A1 | 6/2008 | Meyer et al. |
| 2008/0142960 A1 | 6/2008 | Leal |
| 2008/0175939 A1 | 7/2008 | Danovitch et al. |
| 2008/0182363 A1 | 7/2008 | Amrine et al. |
| 2008/0230887 A1 | 9/2008 | Sun et al. |
| 2008/0246133 A1 | 10/2008 | Derderian |
| 2008/0290492 A1 | 11/2008 | Chung et al. |
| 2008/0290496 A1 | 11/2008 | Park |
| 2009/0008765 A1 | 1/2009 | Yamano et al. |
| 2009/0051025 A1 | 2/2009 | Yang et al. |
| 2009/0085201 A1 | 4/2009 | Mathew |
| 2009/0243073 A1 | 10/2009 | Carson et al. |
| 2009/0289343 A1 | 11/2009 | Chiu et al. |
| 2009/0309206 A1 | 12/2009 | Kim et al. |
| 2010/0007002 A1 | 1/2010 | Pendse |
| 2010/0007032 A1 | 1/2010 | Gallegos |
| 2010/0020503 A1 | 1/2010 | Beaumier et al. |
| 2010/0130000 A1 | 5/2010 | Sutou et al. |
| 2010/0140772 A1 | 6/2010 | Lin et al. |
| 2010/0140779 A1 | 6/2010 | Lin et al. |
| 2010/0144091 A1 | 6/2010 | Kawano et al. |
| 2010/0167451 A1 | 7/2010 | Derderian |
| 2010/0181665 A1 | 7/2010 | Casey et al. |
| 2010/0208432 A1 | 8/2010 | Bhagwagar et al. |
| 2010/0327439 A1 | 12/2010 | Hwang et al. |
| 2011/0031598 A1 | 2/2011 | Lee et al. |
| 2011/0057327 A1 | 3/2011 | Yoshida et al. |
| 2011/0062592 A1 | 3/2011 | Lee et al. |
| 2011/0062602 A1 | 3/2011 | Ahn et al. |
| 2011/0068427 A1 | 3/2011 | Paek et al. |
| 2011/0068478 A1 | 3/2011 | Pagaila et al. |
| 2011/0084382 A1 | 4/2011 | Chen et al. |
| 2011/0204505 A1 | 8/2011 | Pagaila et al. |
| 2011/0227223 A1 | 9/2011 | Wu et al. |
| 2011/0233782 A1 | 9/2011 | Chang et al. |
| 2011/0237026 A1 | 9/2011 | Farooq et al. |
| 2011/0254156 A1 | 10/2011 | Lin |
| 2012/0056329 A1 | 3/2012 | Pagaila et al. |
| 2012/0061855 A1 | 3/2012 | Do et al. |
| 2012/0069683 A1 | 3/2012 | Kamata et al. |
| 2012/0088332 A1 | 4/2012 | Lee et al. |
| 2012/0094443 A1 | 4/2012 | Pratt et al. |
| 2012/0153453 A1 | 6/2012 | Ankireddi et al. |
| 2012/0168917 A1 | 7/2012 | Yim et al. |
| 2012/0178218 A1 | 7/2012 | Bauer et al. |
| 2012/0326307 A1 | 12/2012 | Jeong et al. |
| 2012/0326324 A1 | 12/2012 | Lee et al. |
| 2013/0017643 A1 | 1/2013 | Lin et al. |
| 2013/0037942 A1 | 2/2013 | Hwang et al. |
| 2013/0040427 A1 | 2/2013 | Hu et al. |
| 2013/0052775 A1 | 2/2013 | Kim et al. |
| 2013/0062786 A1 | 3/2013 | Leung et al. |
| 2013/0075924 A1 | 3/2013 | Lin et al. |
| 2013/0078765 A1 | 3/2013 | Lin et al. |
| 2013/0078915 A1 | 3/2013 | Zhao et al. |
| 2013/0082399 A1 | 4/2013 | Kim et al. |
| 2013/0134559 A1 | 5/2013 | Lin et al. |
| 2013/0168849 A1 | 7/2013 | Scanlan |
| 2013/0175702 A1 | 7/2013 | Choi et al. |
| 2013/0214402 A1 | 8/2013 | Park et al. |
| 2013/0241039 A1 | 9/2013 | Choi et al. |
| 2013/0309814 A1 | 11/2013 | Too et al. |
| 2013/0320517 A1 | 12/2013 | Shirley |
| 2013/0328192 A1 | 12/2013 | Lee et al. |
| 2014/0048906 A1 | 2/2014 | Shim et al. |
| 2014/0061893 A1 | 3/2014 | Saeidi et al. |
| 2014/0077366 A1 | 3/2014 | Kim et al. |
| 2014/0084456 A1 | 3/2014 | Kang et al. |
| 2014/0124949 A1 | 5/2014 | Paek |
| 2014/0131856 A1 | 5/2014 | Do |
| 2014/0131886 A1 | 5/2014 | Paek et al. |
| 2014/0138817 A1 | 5/2014 | Paek et al. |
| 2014/0210109 A1 | 7/2014 | Tanaka et al. |
| 2014/0217619 A1 | 8/2014 | Zhao et al. |
| 2014/0246779 A1 | 9/2014 | Lin et al. |
| 2014/0264933 A1 | 9/2014 | Yu et al. |
| 2014/0284785 A1 | 9/2014 | Sung et al. |
| 2014/0319661 A1 | 10/2014 | Pagaila |
| 2015/0021791 A1 | 1/2015 | Park |
| 2015/0125993 A1 | 5/2015 | Lee et al. |
| 2015/0137384 A1 | 5/2015 | Huemoeller et al. |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |
| JP | 2001-118947 | 10/1999 |
| JP | 2005-333052 | 12/2005 |
| JP | 2006-073622 | 3/2006 |
| JP | 2007-043090 | 2/2007 |
| KR | 10-1997-005712 | 4/1997 |
| KR | 20-0412028 | 3/2006 |
| KR | 1020060050579 | 5/2006 |
| KR | 10-0787894 | 12/2007 |
| KR | 10-2009-0100895 | 9/2009 |
| KR | 10-0990939 | 11/2010 |
| KR | 10-1056749 | 8/2011 |
| KR | 1020120053332 | 5/2012 |
| KR | 10-1151258 | 6/2012 |
| KR | 1020130092208 | 8/2013 |

OTHER PUBLICATIONS

Office Action corresponding to Korean Patent Application No. 10-2012-0015799, 4 pages, May 7, 2013.Office Action corresponding to Korean Patent Application No. 10-2012-0104330,4 pages, Nov. 5, 2013.

Office Action corresponding to Korean Patent Application No. 10-2012-0104330,4 pages, Nov. 5, 2013.

CAD_CIM Requirements Article IMAPS, Sep./Oct. 1994.

IBM Technical Disclosure Bulletin, "Microstructure Solder Mask by Means of a Laser", vol. 36, Issue 11, p. 589, Nov. 1, 1993. (NN9311589).

Kim et al., "Application of Through Mold Via (TMV) as PoP base package", 58.sup.th ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Nicholls et al., "Methods and Structures for Increasing the Allowable Die Size in TMV Packages," U.S. Appl. No. 13/398,646, filed Feb. 16, 2012.

Nicholls et al., "Methods and Structures for Increasing the Allowable Die Size in TMV Packages," U.S. Appl. No. 61/444,306, filed Feb. 18, 2011.

Huemoeller et al., "Build Up Motherboard Fabrication Method and Structure", U.S. Appl. No. 11/824,395, filed Jun. 29, 2007.

Hiner et al., "Printed Wiring Motherboard Having Bonded Interconnect Redistribution Mesa", U.S. Appl. No. 10/992,371, filed Nov. 18, 2004.

PCT, Notification of Transmittal of the International Search Report and the Written Opinion of the International Searching Authority, or the Declaration, in International application No. PCT/US13/69057 dated Apr. 4, 2014 (17 pages).

Office Action corresponding to Korean Patent Application No. 10-2013-0132666, 10 pages, Mar. 4, 2015.

Zohni, Wael (Invensas Corporation), Ultra high-bandwidth PoP infrastructure development, 4 pages, Nov.-Dec. 2013.

Invensas™ BVA PoP for Mobile Computing: Untra-High 10 without TSVs, 4 pages, Jun. 26, 2012.

SEMICONDUCTOR DEVICE AND MANUFACTURING METHOD THEREOF

CROSS-REFERENCE TO RELATED APPLICATIONS/INCORPORATION BY REFERENCE

The present application is a CONTINUATION of U.S. patent application Ser. No. 13/863,457, filed Apr. 16, 2013, and titled "SEMICONDUCTOR DEVICE AND MANUFACTURING METHOD THEREOF," which makes reference to, claims priority to, and claims the benefit of Korean Patent Application No. 10-2012-0131967, filed on Nov. 20, 2012. The contents of the above-identified applications are hereby incorporated herein by reference in their entirety. This application is also related to U.S. patent application Ser. No. 13/753,120, filed Jan. 29, 2013, and titled "SEMICONDUCTOR DEVICE AND METHOD OF MANUFACTURING SEMICONDUCTOR DEVICE"; U.S. patent application Ser. No. 14/083,779, filed on Nov. 19, 2013, and titled "SEMICONDUCTOR DEVICE WITH THROUGH-SILICON VIA-LESS DEEP WELLS"; U.S. patent application Ser. No. 14/218,265, filed Mar. 18, 2014, and titled "SEMICONDUCTOR DEVICE AND MANUFACTURING METHOD THEREOF"; U.S. patent application Ser. No. 14/313,724, filed Jun. 24, 2014, and titled "SEMICONDUCTOR DEVICE AND MANUFACTURING METHOD THEREOF"; U.S. patent application Ser. No. 14/444,450, Jul. 28, 2014, and titled "SEMICONDUCTOR DEVICE WITH THIN REDISTRIBUTION LAYERS"; U.S. patent application Ser. No. 14/524,443, filed Oct. 27, 2014, and titled "SEMICONDUCTOR DEVICE WITH REDUCED THICKNESS"; U.S. patent application Ser. No. 14/532,532, filed Nov. 4, 2014, and titled "INTERPOSER, MANUFACTURING METHOD THEREOF, SEMICONDUCTOR PACKAGE USING THE SAME, AND METHOD FOR FABRICATING THE SEMICONDUCTOR PACKAGE"; U.S. patent application Ser. No. 14/546,484, filed Nov. 18, 2014, and titled "SEMICONDUCTOR DEVICE WITH REDUCED WARPAGE"; and U.S. patent application Ser. No. 14/671,095, filed Mar. 27, 2015, and titled "SEMICONDUCTOR DEVICE AND MANUFACTURING METHOD THEREOF."

FIELD OF THE INVENTION

The present invention relates to a semiconductor device and a method of manufacturing the same.

BACKGROUND OF THE INVENTION

A semiconductor device manufactured by installing a semiconductor die onto an interposer and stacking the interposer on another semiconductor die or substrate may be referred to herein as a 2.5D package. What is referred to herein as a 3D package may be obtained by directly stacking one semiconductor die onto another semiconductor die or substrate without utilizing an interposer.

The interposer of the 2.5D package may include a plurality of through silicon vias so as to permit an electrical signal to flow between an upper semiconductor die and a lower semiconductor die or substrate. Accordingly, the through silicon vias as well as circuit patterns may be formed in the interposer in a semiconductor device, which may increase manufacturing cost and may result in a thicker device.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A semiconductor device and method of manufacturing a semiconductor device, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Figure 1A:
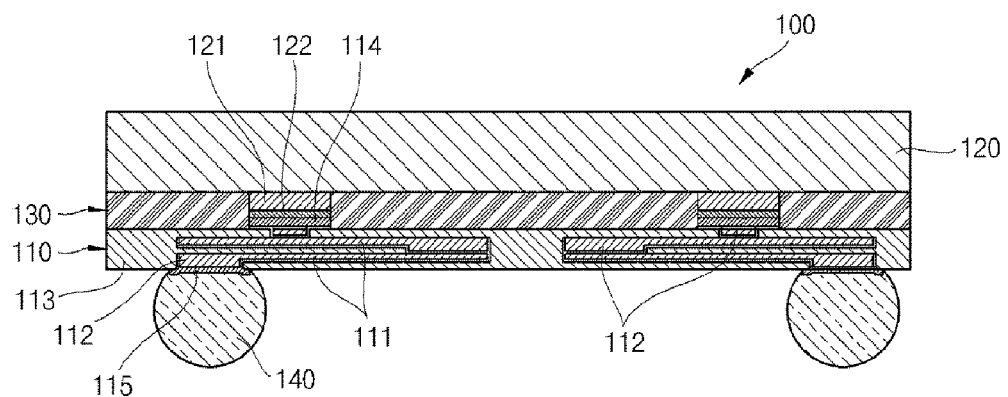
FIG. 1A illustrates a cross-sectional view of an exemplary semiconductor device, in accordance with a representative embodiment of the present invention.

Aspects of the present invention relate to a semiconductor device and a method of manufacturing the same. More specifically, representative embodiments of the present invention may relate to a semiconductor device and a method of manufacturing such a semiconductor device.

Preferred embodiments of the invention will be described in more detail with reference to the accompanying drawings. In such a manner, those skilled in the art will easily realize the embodiments of the present invention upon a careful reading of the present patent application.

It should be noted that the dimensions and relative sizes of each element in the accompanying drawings may be exaggerated for clarity, and that like reference numerals refer to like elements. The term "semiconductor die" in this specification includes, for example, a semiconductor chip, a semiconductor wafer or an equivalent thereof, including an active circuit and/or a passive circuit formed thereon, a semiconductor wafer, or equivalents thereof. In addition, the term "dummy substrate" used herein includes a silicon substrate, a glass substrate, and any suitable equivalent thereof. Further, the term "dielectric layer" used herein includes a silicon oxide layer, a silicon nitride layer, an organic layer, and any suitable equivalent thereof. In the following description, it will be understood that when one part is electrically connected to another part, the one part can be directly connected to the other part, or intervening parts may also be present.

As utilized herein, the term "exemplary" means serving as a non-limiting example, instance, or illustration. Also, as utilized herein, the term "may" is generally synonymous with the phrase "may, for example", in that such term is generally utilized to present non-limiting example illustrations. As used herein, the term "and/or" includes any and all combinations of one or more of the associated listed items.

The terminology used herein is for the purpose of describing particular example embodiments only and is not intended to be limiting of the present inventive concept. As used herein, the singular forms are intended to include the plural forms as well, unless the context clearly indicates otherwise. It will be further understood that the terms "comprise" and/or "comprising," when used in this specification, specify the presence of stated features, integers, steps, operations, elements, and/or groups, but do not preclude the presence or addition of one or more other features, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Example embodiments will now be described more fully hereinafter with reference to the accompanying drawings.

The present inventive concept may, however, be embodied in different forms and should not be construed as limited to the embodiments set forth herein. Rather, these embodiments are provided so that this disclosure will be thorough and complete, and will fully convey the scope of the invention to those skilled in the art.

FIG. 1A illustrates a cross-sectional view of an exemplary semiconductor device 100, in accordance with a representative embodiment of the present invention.

As illustrated in FIG. 1A, a semiconductor device 100 in accordance with representative embodiment of the present invention may include an interposer 110, a semiconductor die 120, an encapsulant 130 and one or more bumps 140.

In a representative embodiment of the present invention, the interposer 110 may include a redistribution layer 111, a conductive via 112 and a dielectric layer 113. As shown in the illustration of FIG. 1A, the interposer 110 may include a multi-layer structure of the redistribution layer 111 and the conductive via 112, and the redistribution layer 111 and the conductive via 112 may be passivated by the dielectric layer 113. In other words, the interposer 110 may have a multi-layer structure such as, for example, one to five layers comprising elements such as the redistribution layer 111, the conductive via 112 and the dielectric layer 113 of FIG. 1A. In addition, the conductive via 112 connected to the redistribution layer 111 may be formed facing the upper portion of the dielectric layer 113, and the conductive via 112 connected to the redistribution layer 111 may be formed facing the lower portion of the dielectric layer 113. A semiconductor die 120 may make an electrical connection to the conductive via 112 facing the upper portion of the dielectric layer 113, and the bump 140 may make an electrical connection to the conductive via 112 facing the lower portion of the dielectric layer 113, as explained below. In addition, an upper under bump metal 114 may be formed at the conductive via 112 facing the upper portion of the dielectric layer 113, and the semiconductor die 120 may be electrically connected to the upper under bump metal 114 by means of a solder layer 122. A lower under bump metal 115 may be formed at the conductive via 112 facing the lower portion of the dielectric layer 113, and the bump 140 may be electrically connected to the lower under bump metal 115.

In a representative embodiment of the present invention, the redistribution layer 111 and the conductive via 112 may be formed by using a material selected from copper, aluminum, or any suitable equivalent thereof. In addition, the dielectric layer 113 may be formed as one selected from a silicon oxide layer, a silicon nitride layer, an organic layer, or any suitable equivalent thereof. It should be noted that use of the example materials suggested above for the redistribution layer 111, the conductive via 112, and the dielectric layer 113 does not necessarily represent any specific limitations of the present invention, unless recited in the claims. When a silicon oxide layer or a silicon nitride layer is used as the dielectric layer 113, the redistribution layer 111 and the conductive via 112 may be formed to have minute pitches of less than 1 micron. In some representative embodiments of the present invention, a passive device may be embedded. When the dielectric layer 113 is a silicon oxide layer or a silicon nitride layer, the patterning of the redistribution layer 111, the conductive via 112 and the dielectric layer 113 in a semiconductor FAB process may have a line width in a range of between, for example, 0.1 µm to 10 µm. In a representative embodiment of the present invention, the line width formed in a package process may be considerably greater than that formed in a semiconductor FAB process. In some representative embodiments of the present invention, a through silicon via may not be necessary in the interposer 110, the thickness of the interposer 110 may be decreased and may be formed at lower cost.

In various representative embodiments of the present invention, the semiconductor die 120 may be, for example, a memory device, a graphics processing unit (GPU), a central processing unit (CPU), or any other semiconductor die. It should be noted, however, that use of these example devices does not necessarily represent a specific limitation of the present invention, unless recited in the claims, and the semiconductor die employed may be other than the devices listed above. The semiconductor die 120 may include a connection terminal 121 that may have an electrical connection with the interposer 110. In a representative embodiment of the present invention, the connection terminal 121 may include a copper pillar and a solder cap formed at the terminal portion thereof, and in some cases, the connection terminal 121 may include a solder bump. In addition, a solder layer 122 may be formed in advance between the connection terminal 121 and the interposer 110 for example, at the upper surface of the conductive via 112 facing the upper portion of the interposer 110 and the upper under bump metal 114 formed thereon, in order to facilitate the connection. In this way, the semiconductor die 120 may make an electrical connection with the redistribution layer 111 of the interposer 110.

In a representative embodiment of the present invention, the encapsulant 130 may be formed between the interposer 110 and the semiconductor die 120, thereby making the interposer 110 and the semiconductor die 120 into one body. More particularly, the encapsulant 130 may wrap the surface portions of the connection terminal 121 and the solder layer 122 formed between the semiconductor die 120 and the interposer 110. In this way, the upper surface and the sides of the semiconductor die 120 may be exposed to the exterior environment, and heat radiating performance of the semiconductor die 120 may be improved.

As shown in the example of FIG. 1A, the sides of the interposer 110, the semiconductor die 120 and the encapsulant 130 may lie in the same planes. Thus, the semiconductor device 100, in accordance with a representative embodiment of the present invention, may be manufactured to have a compact structure.

In some representative embodiments of the present invention, the space between the interposer 110 and the semiconductor die 120 may be filled with an underfill (not illustrated) instead of an encapsulant. That is, an underfill material may cover the lower portions of the sides of the semiconductor die 120 as well as the space between the interposer 110 and the semiconductor die 120. The underfill may increase the physical/mechanical combining force between the interposer 110 and the semiconductor die 120, and may prevent the separation of the interposer 110 and the semiconductor die 120 due to stresses induced by a difference in the coefficients of thermal expansion of the interposer 110 and the semiconductor die 120.

In a representative embodiment of the present invention, the bump 140 may be connected to the conductive via 112 facing the lower portion of the interposer 110 and the lower under bump metal 115 formed at the conductive via 112. More particularly, the lower under bump metal 115 may be formed at the redistribution layer 111 exposed at the lower surface of the interposer 110, and the bump 140 may be connected to the lower under bump metal 115. In some representative embodiments of the present invention, the bump 140 may be smaller than a typical solder ball, and may be referred to as a "micro-bump." In some representative embodiments of the present invention, the diameter of the bump 140 may be about 100 μm or less, while in other representative embodiments, the diameter of the bump 140 to be described below may be in the range of about 200 μm to about 400 μm.

Figure 1B:
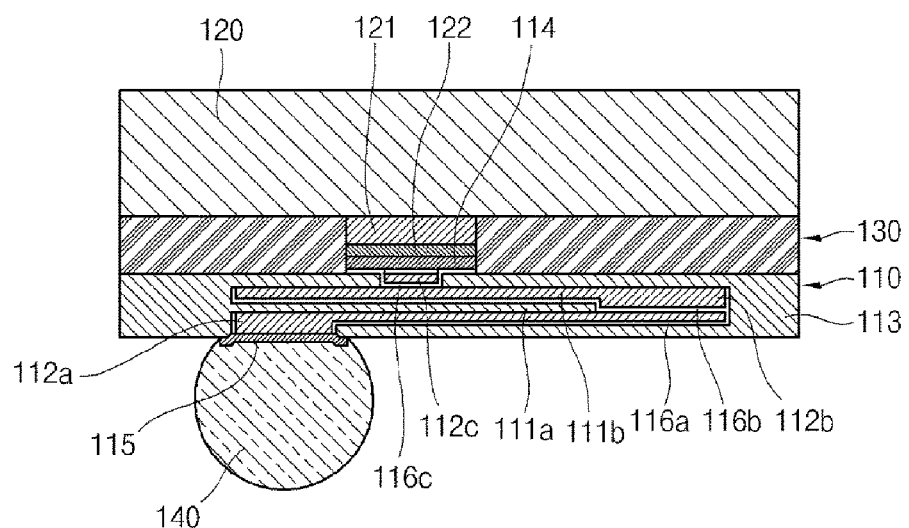
FIG. 1B illustrates a partially enlarged view of a portion of the exemplary semiconductor device of FIG. 1A, that provides additional details of the structure, in accordance with a representative embodiment of the present invention.

FIG. 1B illustrates a partially enlarged view of a portion of the exemplary semiconductor device 100 of FIG. 1A, which provides additional details of the structure, in accordance with a representative embodiment of the present invention. As illustrated in FIG. 1 B, in a representative embodiment of the present invention, seed layers 116a, 116b and 116c may be substantially formed at redistribution layers 111a and 111b, and conductive vias 112a, 112b and 112c. In a representative embodiment of the present invention, the seed layers 116a, 116b and 116c may be, for example, one of a titanium layer or a titanium tungsten layer. It should be noted that use of these example materials does not necessarily represent a specific limitation of the present invention, in that any other suitable material may be used.

In a representative embodiment of the present invention, the conductive via 112a facing the lower portion of the interposer 110 and the redistribution layer 111a may be interconnected, and the seed layer 116a may be formed at the sides and the bottom surface of the redistribution layer 111a.

In addition, the conductive via 112b facing the upper portion of the interposer 110 and the redistribution layer 111b may also be interconnected, and the seed layer 116b may be formed at the sides and the bottom surface of the redistribution layer 111b. As illustrated in FIG. 1B, the seed layer 116b may be interposed between the conductive via 112b and the redistribution layer 111a facing the lower portion of the interposer 110.

Further, the seed layer 116c may be formed at the sides and the bottom surface of the conductive via 112c facing the upper portion of the interposer 110. As shown in FIG. 1B, the seed layer 116c may be interposed between the conductive via 112c facing the upper portion of the interposer 110, and the redistribution layer 111b.

As in the example described above, the conductive vias and the redistribution layers in a representative embodiment of the present invention may be formed beginning with a seed layer as a starting layer, and the conductive vias and the redistribution layers of an interposer in accordance with a representative embodiment of the present invention may be formed to have a minute width and a minute pitch. In this manner, the thickness of such an interposer may be minimized.

Figure 1C:
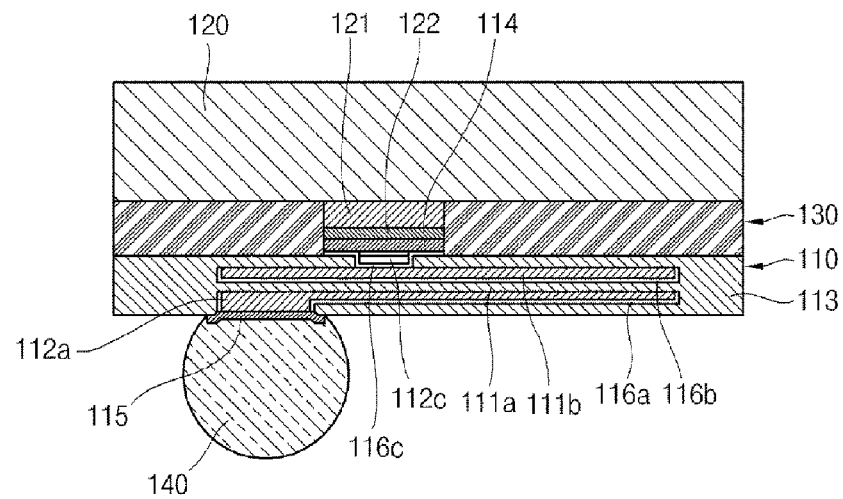
FIG. 1C illustrates a cross-sectional view of an exemplary metal-insulator-metal (MIM) structure provided for an interposer, in accordance with a representative embodiment of the present invention.

FIG. 1C illustrates a cross-sectional view of an exemplary metal-insulator-metal (MIM) structure provided for an interposer, in accordance with a representative embodiment of the present invention. As illustrated in FIG. 1C, an interposer 110 in accordance with a representative embodiment of the present invention may have an embedded metal-insulator-metal (MIM) structure. More particularly, the redistribution layer 111a facing the lower portion of the interposer 110 and the redistribution layer 111b facing the upper portion of the interposer 110 may be electrically separated from one another, having only the dielectric layer 113 between the redistribution layer 111a and the redistribution layer 111b.

In this way, a semiconductor device in accordance with a representative embodiment of the present invention, such as the semiconductor device 100 of FIG. 1C, may be manufactured, for example, in a "flip-chip" manner. A "flip-chip" type semiconductor device 100 may, for example, be installed on a circuit substrate for a typical semiconductor device or for a semiconductor package. A semiconductor device in accordance with representative embodiment of the present invention, such as the semiconductor device 100 of FIG. 1C, may also be installed on, for example, a mother board, a main board, etc.

By employing a representative embodiment of the present invention, a semiconductor device 100 (e.g., a flip-chip device) including a relatively thin interposer 110 without through silicon vias may be realized. The formation of a redistribution layer and conductive vias such as, for example, the redistribution layer 111 and the conductive via 112 of FIG. 1C, having a minute pitch of less than 1 micron, may be accomplished using, for example, a silicon oxide layer or a silicon nitride layer of inorganic materials, in accordance with various representative embodiments of the present invention. In addition, a semiconductor device 100 having an interposer 110 comprising an embedded passive structure may be realized.

Figure 2:
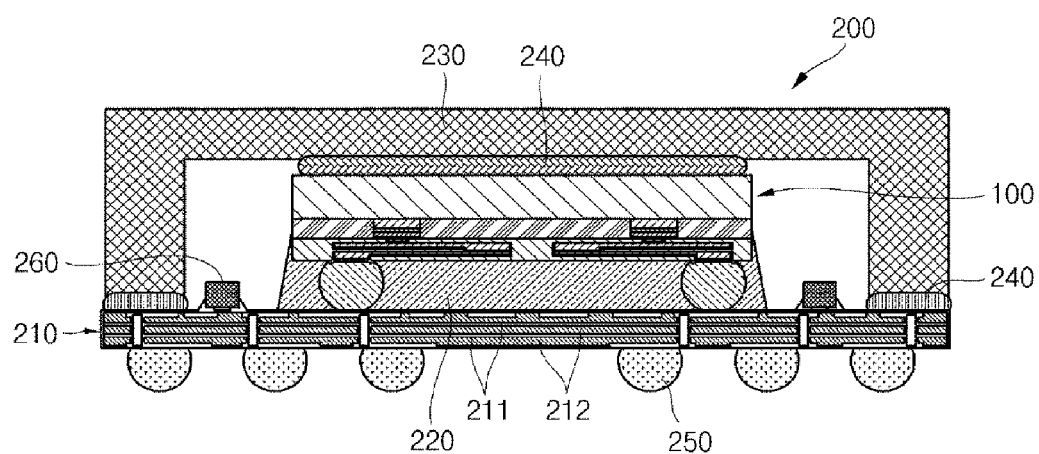
FIG. 2 illustrates a cross-sectional view of an exemplary semiconductor device, in accordance with a representative embodiment of the present invention.

FIG. 2 illustrates a cross-sectional view of an exemplary semiconductor device 200, in accordance with a representative embodiment of the present invention. As illustrated in FIG. 2, a semiconductor device 200 in accordance with a representative embodiment of the present invention may include a flip-chip device such as, for example, the semiconductor device 100 described above with respect to FIGS. 1A, 1B, 1C, a circuit substrate 210, an underfill 220, a cover 230, a thermally conductive adhesive 240, and one or more solder balls 250. The flip-chip device 100 may include one or more bumps such as, or example, the bump 140 of FIGS. 1A, 1B, 1C, which may be formed at the bottom surface the flip-chip device 100, and the bumps 140 may be installed onto the circuit substrate 210. The circuit substrate 210 may include a circuit pattern 211 and an insulating layer 212. In addition, one or more passive devices 260 may be installed on the circuit substrate 210. As described above, the bumps 140 of the flip-chip device 100 may form electrical connections with the circuit pattern 211 of the circuit substrate 210.

In a representative embodiment of the present invention, a gap between the flip-chip device 100 and the circuit substrate 210 may be filled with an underfill material in the manner of the underfill 220 of FIG. 2. That is, the underfill 220 may cover the sides and lower surface of the interposer 110, and cover a portion of the sides of the encapsulant 130 of the flip-chip device 100, as well as wrapping the bumps 140. In this manner, separation of the flip-chip device 100 from the circuit substrate 210 due to stresses induced by a difference in the coefficients of thermal expansion of the flip-chip device 100 and the circuit substrate 210 may be prevented.

In some representative embodiments of the present invention, the cover 230 may be attached to the circuit substrate 210 and at the same time, may roughly wrap the flip-chip device 100. Accordingly, the flip-chip device 100 may be protected from an external environment by the cover 230. The cover 230 may be formed by using a metal, a ceramic, or any suitable equivalent to improve the radiation of heat. It should be noted that such example materials for the cover 230 do not necessarily represent a specific limitation of the present invention, and that other materials may be employed.

The thermally conductive adhesive 240 may be interposed between the flip-chip device 100 and the cover 230, and between the cover 230 and the circuit substrate 210. The thermally conductive adhesive 240 may promptly transfer heat generated by the flip-chip device 100 to the cover 230. The thermally conductive adhesive 240 may also affix the cover 230 to the flip-chip device 100 and the circuit substrate 210.

The solder balls 250 may be attached to the bottom surface of the circuit substrate 210, and the solder balls 250 may make an electrical connection with the circuit pattern 211 of the circuit substrate 210. By using the solder balls 250, a semiconductor device in accordance with a representative embodiment of the present invention, such as the semiconductor device 200, may be installed on, for example, a motherboard, a main board, or other component of an electronic equipment such as, for example, a computer or a smart phone.

As described above, a 2.5D semiconductor device in accordance with a representative embodiment of the present invention such as, for example, the semiconductor device 200 of FIG. 2, which includes a semiconductor device 100 (i.e., a flip-chip device) having a relatively thin interposer 110 without a through silicon hole, may be realized. In addition, the formation of a redistribution layer 111 and a conductive via 112 having a minute pitch of less than about 1 micron may be accomplished by using an inorganic material such as, for example, a silicon oxide layer or a silicon nitride layer. In addition, a semiconductor device such as the semiconductor device 200 of FIG. 2, comprising a semiconductor device 100 including an interposer 110 having an embedded passive structure, in accordance with a representative embodiment of the present invention, may be realized.

Figure 3:
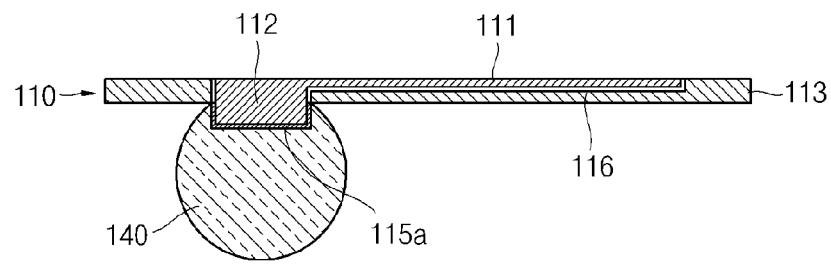
FIG. 3 illustrates a partially enlarged view of a portion of a semiconductor device such as, for example, the semiconductor device of FIG. 2, in accordance with a representative embodiment of the present invention.

FIG. 3 illustrates a partially enlarged view of a portion of a semiconductor device such as, for example, the semiconductor device 200 of FIG. 2, in accordance with a representative embodiment of the present invention. As illustrated in FIG. 3, a conductive via 112 that is electrically connected to a redistribution layer 111 facing the lower portion of an interposer 110, may extend from the dielectric layer 113 to a certain length, in accordance with some representative embodiments of the present invention. In such a representative embodiment, a lower under bump metal 115a may be formed in the region of the conductive via 112 that extends outward from the dielectric layer 113, and a bump 140 may be combined with the extended conductive via 112 outward from the dielectric layer 113 and the lower under bump metal 115a. That is, a portion of the conductive via 112 that extends outward from the dielectric layer 113 and the lower under bump metal 115a may be disposed within the bump 140. Accordingly, the strength of attachment of the bump 140 to the conductive via 112 may be improved in such a representative embodiment of the present invention.

Figure 4:
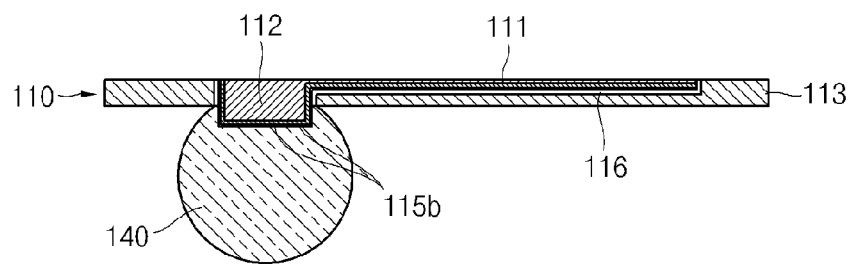
FIG. 4 illustrates a partially enlarged view of a portion of a semiconductor device, in accordance with another representative embodiment of the present invention.

FIG. 4 illustrates a partially enlarged view of a portion of a semiconductor device, in accordance with another representative embodiment of the present invention. As illustrated in FIG. 4, a lower under bump metal 115b may be formed on the conductive via 112 at the face of the lower portion of the interposer 110 and the redistribution layer 111. For example, a seed layer 116 may be formed on a dielectric layer 113, and the lower under bump metal 115b including, for example, a nickel gold layer, may be formed on the seed layer 116, and the conductive via 112 and the redistribution layer 111 may be formed on the lower under bump metal 115b. In addition, the seed layer at the bottom surface and the side portion of the conductive via 112 may be removed, and the lower under bump metal 115b may be exposed, enabling an electrical connection with the bump 140. In this case, the conductive via 112 and the lower under bump metal 115b on the surface thereof may extend from the dielectric layer 113 to a certain length. Accordingly, a portion of the conductive via 112 that extends outward from the dielectric layer 113 and the lower under bump metal 115b may be present within the bump 140. Thus, the strength of attachment between the conductive via 112 and the bump 140 may be improved.

FIGS. 5A to 5K illustrate cross-sectional views showing the steps of an exemplary method of manufacturing a semiconductor device, in accordance with a representative embodiment of the present invention. As illustrated in FIGS. 5A to 5K, the example method of manufacturing a semiconductor device in accordance with a representative embodiment of the present invention may include a step of forming an interposer 110 on a dummy substrate 310. The step of forming the interposer 110 may include a step of forming a dielectric layer 113 on the dummy substrate 310, a step of forming a pattern 113a on the dielectric layer 113, a step of forming a via 113b through the dielectric layer 113, a step of forming a redistribution layer 111 and a conductive via 112 over the pattern 113a and the via 113b, a step of providing a patterned redistribution layer 111 by grinding the redistribution layer 111, a step of repeating the above described steps, for example, one to five times, a step of forming a dielectric layer 113 again, a step of forming a via 113b on the dielectric layer 113 and forming a conductive via 112 at the via 113b, a step of forming an upper under bump metal 114 at the conductive via 112, a step of electrically connecting the semiconductor die 120 to the interposer 110 and encapsulating using an encapsulant 130, a step of removing the dummy substrate 310, and a step of forming a lower under bump metal 115 at the conductive via 112 forwarding the lower portion of the interposer 110 and connecting the lower under bump metal 115 with a bump 140. The above described steps will be described in more detail below.

Figure 5A:
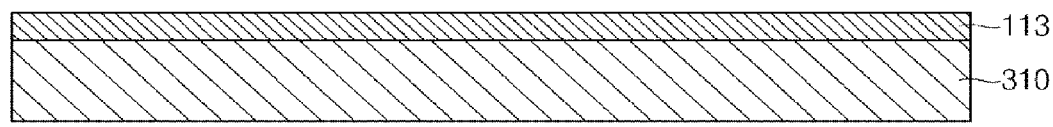
FIGS. 5A to 5K illustrate cross-sectional views showing the steps of an exemplary method of manufacturing a semiconductor device, in accordance with a representative embodiment of the present invention.

As illustrated in FIG. 5A, at the step of forming the dielectric layer 113 on the dummy substrate 310, the roughly flat dielectric layer 113 may be formed to a uniform thickness on the dummy substrate 310. In a representative embodiment of the present invention, the dummy substrate 310 may be formed by using one selected from, for example, silicon, glass, or any suitable equivalent. It should be noted that use of these example materials does not necessarily represent a specific limitation of the present invention, unless recited in the claims, and that any other suitable material may be employed. In addition, the dielectric layer 113 may be one selected from the group consisting of, for example, a silicon oxide layer, a silicon nitride layer, an organic layer, or any suitable equivalent. It should again be noted that use of these example materials does not necessarily represent a specific limitation of the present invention, unless recited in the claims, and that any other suitable material may be employed.

Figure 5B:
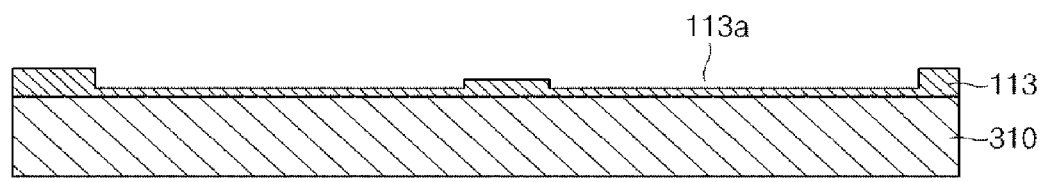

As illustrated in FIG. 5B, at the step of forming the pattern 113a on the dielectric layer 113, the pattern 113a may be formed to a certain depth by exposing the dielectric layer 113 to, for example, a laser beam. The pattern 113a may also be formed by, for example, a wet etching process using a chemical solution, by a dry etching process using plasma, or by a conventional photo process, instead of using a laser beam. It should be noted that these example techniques are intended to be illustrative and not limiting, as the use of these techniques does not necessarily represent a specific limitation of the present invention, unless recited by the claims, and that other suitable techniques of forming pattern 113a may be employed.

Figure 5C:
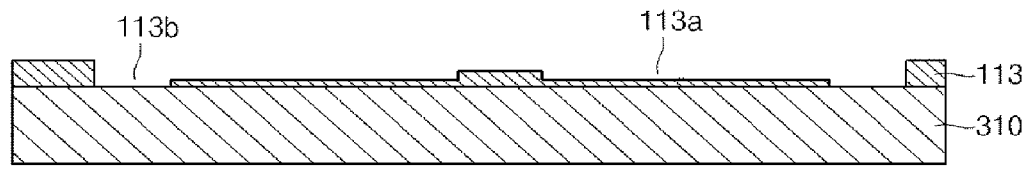

The pattern 113a may also be formed by, for example, a wet etching process using a chemical solution, by a dry etching process using plasma, or by a conventional photo process, instead of using a laser beam. It should be noted that these example techniques are intended to be illustrative and not limiting, as the use of these techniques does not necessarily represent a specific limitation of the present invention, unless recited by the claims, and that other suitable techniques of forming pattern 113a may be employed. The formation of the via 113b may, for example as shown in FIG. 5C, expose a portion of the dummy substrate 310 to exterior. In addition, a portion of the dummy substrate 310 may also be removed to a certain depth, thereby forming an extended conductive via.

Figure 5D:
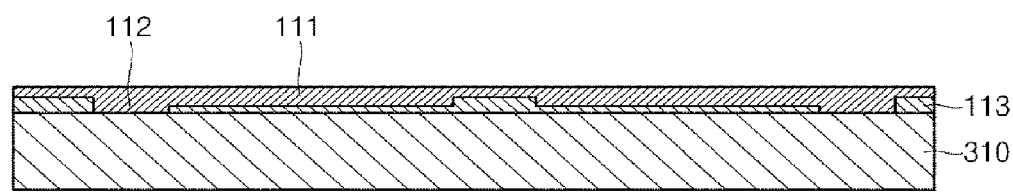

As illustrated in FIG. 5D, at the step of forming the redistribution layer 111 and the conductive via 112 at the pattern 113a and the via 113b, a seed layer (not illustrated) may be formed on the pattern 113a and the via 113b of the dielectric layer 113, and the redistribution layer 111 and the conductive via 112 may be formed to a uniform thickness on the seed layer at the same time. Particularly, copper or aluminum, for example, may be electroplated on such a seed layer to cover the pattern 113a and the via 113b. In this way, the conductive via 112 may face the lower portion of the interposer 110.

Figure 5E:
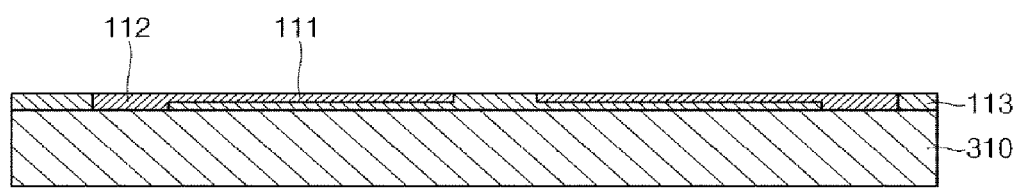

As illustrated in FIG. 5E, at the step of providing the patterned redistribution layer 111 by grinding the redistribution layer 111, the redistribution layer 111 and the conductive via 112 disposed higher than the dielectric layer 113 may be ground or/and etched to a certain thickness to separate portions of the connected redistribution layer 111 from each other.

Figure 5F:
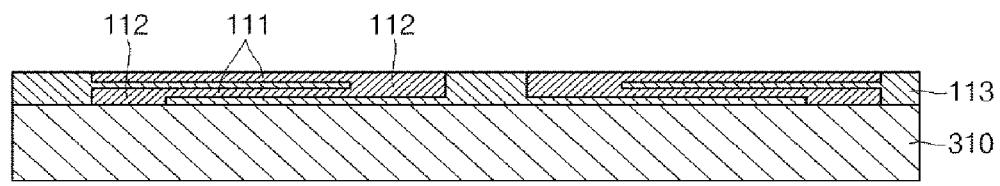

As illustrated in FIG. 5F, at the step of repeating the above described steps from, for example, one to five times, the processes illustrated in FIGS. 5A to 5E may be repeated, for example, one to five times to obtain a multi-layer structure of the conductive via 112 and the redistribution layer 111. It should be noted that the range of repetitions of the steps given in this illustrative example is meant to aid in understanding the concepts presented, and not to limit these teachings, and that the number of repetitions of the above operation does not necessarily represent a specific limitation of the present invention, unless recited in the claims.

Figure 5G:
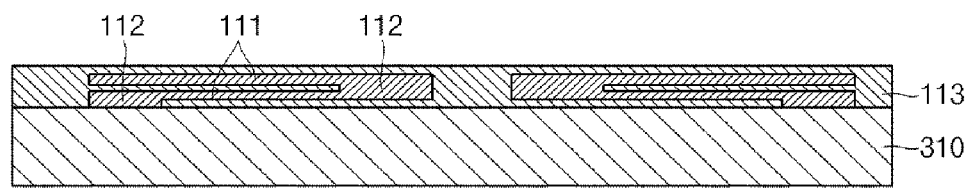

As illustrated in FIG. 5G, at the step of forming the dielectric layer 113 again, the dielectric layer 113 may be formed again on the multi-layer structure of the conductive via 112 and the redistribution layer 111. The dielectric layer 113 may also be formed by one selected from the group consisting of, for example, a silicon oxide layer, a silicon nitride layer, an organic layer, or any suitable equivalent of these materials. It should be noted that use of these materials does not necessarily represent a specific limitation of the present invention, unless recited by the claims, and that any suitable materials may be used.

Figure 5H:
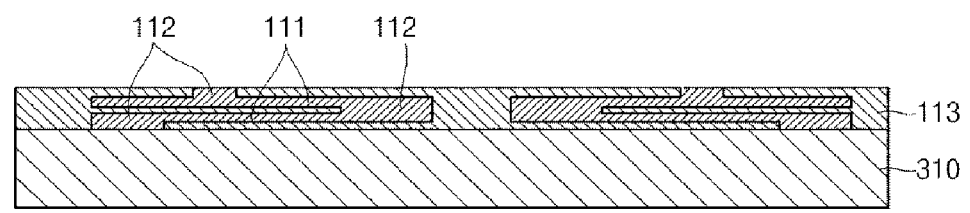

As illustrated in FIG. 5H, at the step of forming the via at the dielectric layer 113 and forming the conductive via 112 at the via, the via may be formed at the dielectric layer 113 by means of, for example, a laser or any other suitable technique as discussed above, and the conductive via 112 may be further formed at the via to make an electrical connection to the redistribution layer 111 previously formed. In this way, the conductive via 112 facing the upper portion of the interposer 110 may be exposed to the exterior environment.

Figure 5I:
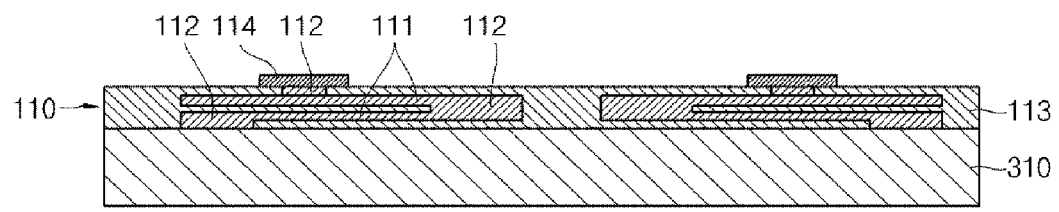

As illustrated in FIG. 5I, at the step of forming the upper under bump metal 114 at the conductive via 112, the upper under bump metal 114 may be formed at the conductive via 112 facing the upper portion of the interposer 110. In a representative embodiment of the present invention, a connection terminal 121 of a semiconductor die 120 may be electrically connected to the upper under bump metal 114, in a following process.

Figure 5J:
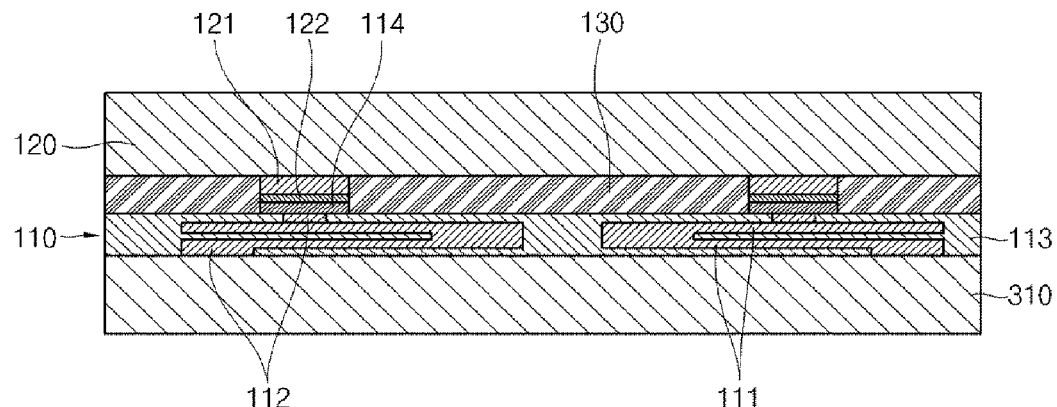

As illustrated in FIG. 5J, at the step of making an electrical connection of the semiconductor die 120 to the interposer 110 and encapsulating using the encapsulant 130, the connection terminal 121 of the semiconductor die 120 may make an electrical connection with the conductive via 112 facing the upper portion of the interposer 110 and the upper under bump metal 114 formed thereon by a solder layer 122, and the lower surface of the semiconductor die 120 may be encapsulated by the encapsulant 130. In a representative embodiment of the present invention, any space between the interposer 110 and the semiconductor die 120 may be filled with the encapsulant 130. In some representative embodiments of the present invention, some or all of the space between the interposer 110 and the semiconductor die 120 may be filled with an underfill.

Figure 5K:
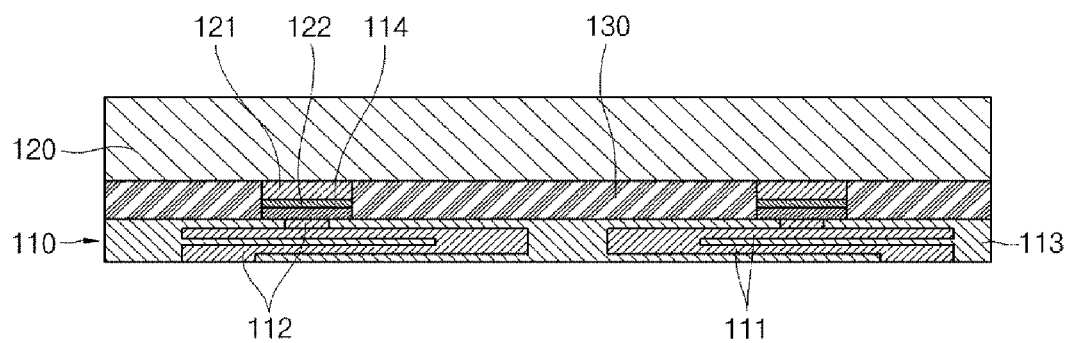

As illustrated in FIG. 5K, at the step of removing the dummy substrate 310, the dummy substrate 310 attached on the bottom surface of the interposer 110 may be removed by means of, for example, a grinding process, a chemical etching process, or any combination of these or any other suitable techniques. In this way, the conductive via 112 facing the lower portion of the interposer 110 may, for example, be coplanar with the dielectric layer 113.

In the manner described above, a method of manufacturing a semiconductor device including a relatively thin interposer 110 without a through silicon via may be realized, in accordance with a representative embodiment of the present invention.

As discussed above, the interposer 110 of a representative embodiment of the present invention may include a dielectric layer such as, for example, the dielectric layer 113 having a high dielectric constant, and may be fabricated on a dummy substrate such as the dummy substrate 310, formed from, for example, silicon or glass. By employing the exemplary method of manufacturing a semiconductor device given above, in accordance with a representative embodiment of the present invention, a redistribution layer such as the redistribution layer 111, having a minute pitch of less than about one micron, and an embedded passive structure, may be realized. In addition, some representative embodiments of the present invention provide a structure excluding an extended portion for forming a connection between a redistribution layer (e.g., the redistribution layer 111) and a bump (e.g., the bump 140).

Figure 6A:
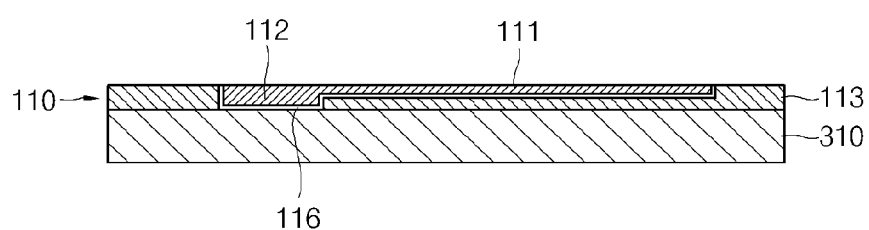
FIGS. 6A to 6C show cross-sectional views illustrating exemplary steps of a method of manufacturing a semiconductor device, in accordance with a representative embodiment of the present invention.
Figure 6B:
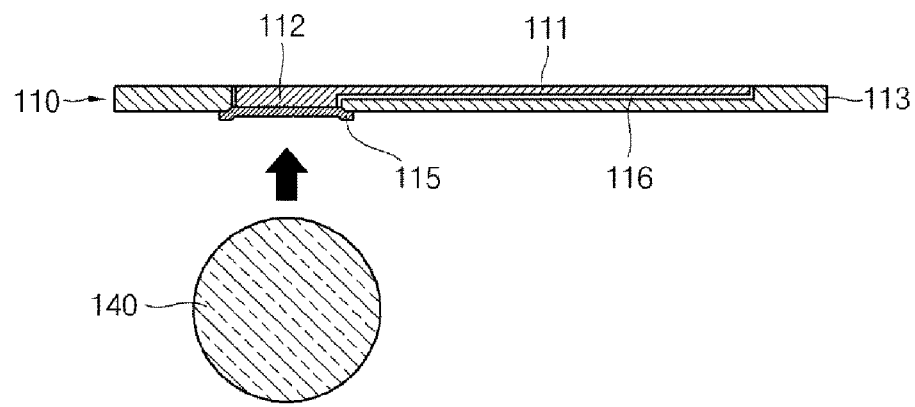
Figure 6C:
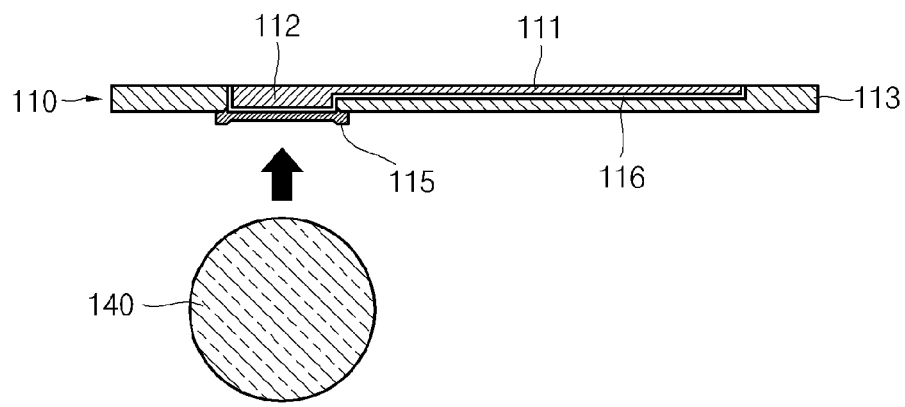

FIGS. 6A to 6C show cross-sectional views illustrating exemplary steps of a method of manufacturing a semiconductor device, in accordance with a representative embodiment of the present invention.

FIG. 6A shows the semiconductor device comprising a dummy substrate 310 and an interposer 110 having a dielectric layer 113, a redistribution layer 111, and a conductive via 112. As illustrated in FIG. 6A, a seed layer 116 may be formed at the bottom surface of the conductive via 112 facing the lower portion of the interposer 110.

FIG. 6B illustrates that, after removing the dummy substrate 310, the seed layer 116 formed at the bottom surface of the conductive via 112 may be removed using, for example, an etching process, and a lower under bump metal 115 may be formed in its place. In a representative embodiment of the present invention, the bottom surface of the conductive via 112 may be slightly removed by the etching process, and the under bump metal 115 may be formed using one method selected from, for example, an electroplating method, an electro-less plating method, a sputtering method, an evaporation method, a chemical vaporization deposition method, or any suitable equivalent of those exemplary techniques. It should be noted that use of those techniques does not necessarily represent a specific limitation of the present invention, unless recited in the claims. In a representative embodiment of the present invention, a bump 140 may then be electrically connected to the lower under bump metal 115.

As illustrated in FIG. 6C, after removing the dummy substrate 310, in some representative embodiments of the present invention, the seed layer 116 formed at the bottom surface of the conductive via 112 may not be removed but may remain. That is, the under bump metal 115 may be directly formed under the seed layer 116 by using one method selected from, for example, an electroplating method, an electro-less plating method, a sputtering method, an evaporation method, a chemical vaporization deposition method, or any suitable equivalent of these techniques. It should be noted that use of these exemplary techniques does not necessarily represent a specific limitation of the present invention, unless recited by the claims, as other techniques may be employed.

Figure 7A:
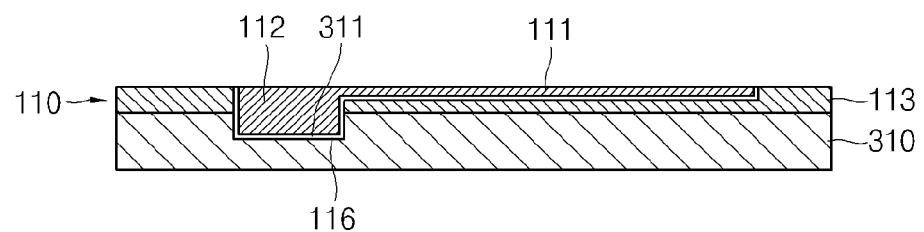
FIGS. 7A and 7B illustrate cross-sectional views showing the steps of an exemplary method of manufacturing a semiconductor device, in accordance with a representative embodiment of the present invention.
Figure 7B:
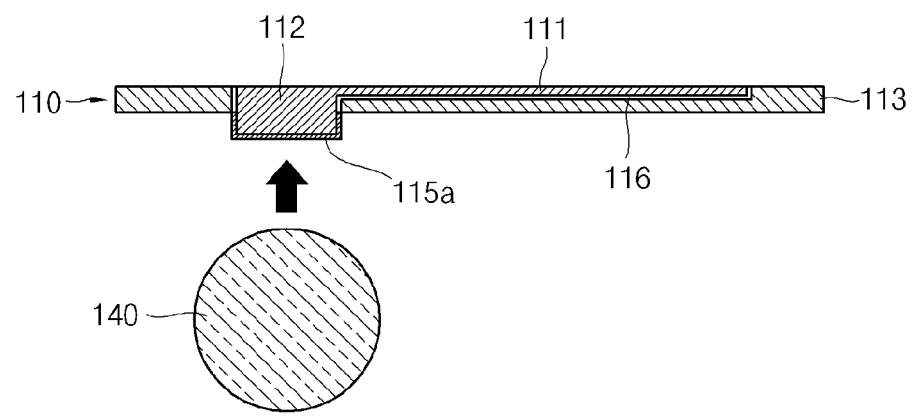

FIGS. 7A and 7B illustrate cross-sectional views showing the steps of an exemplary method of manufacturing a semiconductor device, in accordance with a representative embodiment of the present invention.

As illustrated in FIG. 7A, in a representative embodiment of the present invention, a groove 311 may be formed by removing a portion of a dummy substrate 310 by means of, for example, a laser beam or an etching process, and a seed layer 116 may then be formed along the groove 311 of the dummy substrate 310. In this manner, a conductive via 112 may have a combined shape in the groove 311 of the dummy substrate 310.

As illustrated in FIG. 7B, after removing the dummy substrate 310, the conductive via 112 may extend through the dielectric layer 113. In some representative embodiments of the present invention, the seed layer 116 formed at the surface (e.g., at the bottom surface and both sides) of the extended conductive via 112 may be removed, and a lower under bump metal 115a may be formed in its place. That is, in a representative embodiment of the present invention, the lower under bump metal 115a may also extend beyond or protrude from the surface of the dielectric layer 113.

In a representative embodiment of the present invention, as the contact area between the bump 140 and the conductive via 112 or the lower under bump metal 115a increases, the attachment of the bump 140 and the conductive via 112 or the lower under bump metal 115a may be improved. The use of some representative embodiments of the present invention result a structure in which the conductive via 112 or the lower under bump metal 115a is disposed within the bump 140.

Figure 8A:
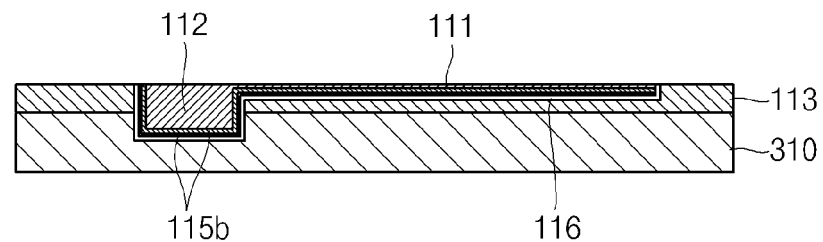
FIGS. 8A and 8B show cross-sectional views illustrating the steps of an exemplary method of manufacturing a semiconductor device, in accordance with another representative embodiment of the present invention.
Figure 8B:
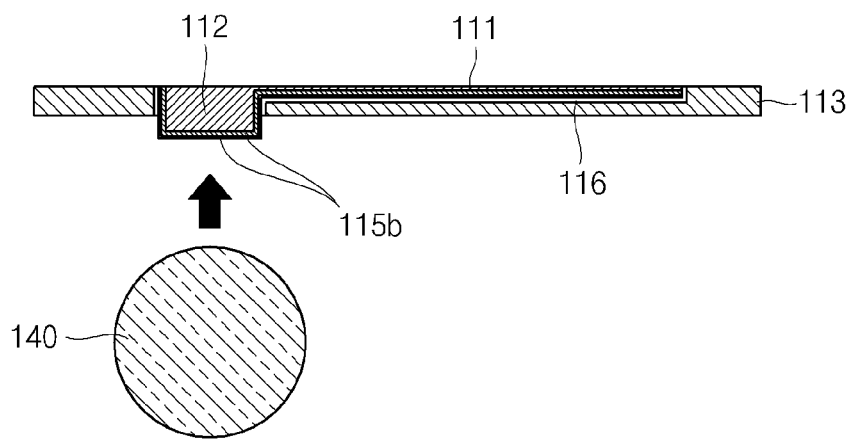

FIGS. 8A and 8B show cross-sectional views illustrating the steps of an exemplary method of manufacturing a semiconductor device, in accordance with another representative embodiment of the present invention.

As illustrated in FIG. 8A, a conductive via 112 and a redistribution layer 111 may be formed on the surface of a lower under bump metal 115b that includes, for example, a seed layer 116 and alternately integrated nickel and gold layers.

As illustrated in FIG. 8B, after removing a dummy substrate 310, the conductive via 112, the lower under bump metal 115b and the seed layer 116 may have a shape extending or protruding from the dielectric layer 113. In this case, the seed layer 116 formed at the surface (e.g., at the bottom surface and both sides) of the conductive via 112 with under bump metal 115b, may be removed, and the lower under bump metal 115b may be exposed to the exterior environment. In this manner, the lower under bump metal 115b may also have an extended or protruding shape from the dielectric layer 113.

Accordingly, as the contact area between the bump 140 and the conductive via 112 or the lower under bump metal 115b increases, the attachment of the bump 140 with the conductive via 112 or the lower under bump metal 115b may be improved. In other words, a representative embodiment of the present invention may provide a structure in which the conductive via 112 or the lower under bump metal 115b is disposed within the bump 140, improving attachment of the bump 140 to the conductive via 112 or under bump metal 115b.

FIGS. 9A to 9D illustrate cross-sectional views showing the steps of a method of manufacturing a semiconductor device, in accordance with a representative embodiment of the present invention.

Figure 9A:
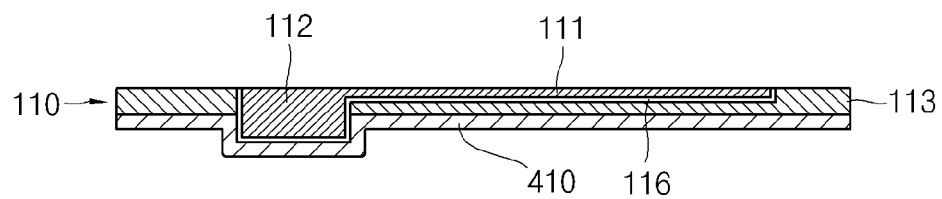
FIGS. 9A to 9D illustrate cross-sectional views showing the steps of a method of manufacturing a semiconductor device, in accordance with a representative embodiment of the present invention.

As illustrated in FIG. 9A, in another representative embodiment of the present invention, a second dielectric layer 410 with a predetermined thickness may be formed on the bottom surface of a first dielectric layer 113 after a dummy substrate (such as, for example, the dummy substrate 310 of FIG. 8A) is removed. In the illustration of FIG. 9A, a lower surface and side surface of the conductive via 112 are shown covered with the second dielectric layer 410. In a representative embodiment of the present invention, the material of the second dielectric layer 410 may be the same as or different from that of the first dielectric layer 113.

Figure 9B:
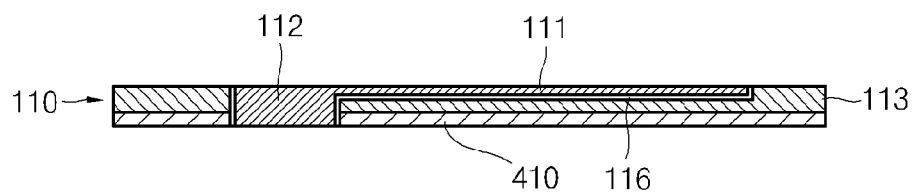

As illustrated in FIG. 9B, using a leveling process, a portion of the second dielectric layer 410 corresponding to the lower surface of the conductive via 112 may be removed and thereby expose the lower surface of the conductive via 112 to an outside environment. In various representative embodiments of the present invention, the leveling process may be, for example, a chemical and/or mechanical planarization process.

Figure 9C:
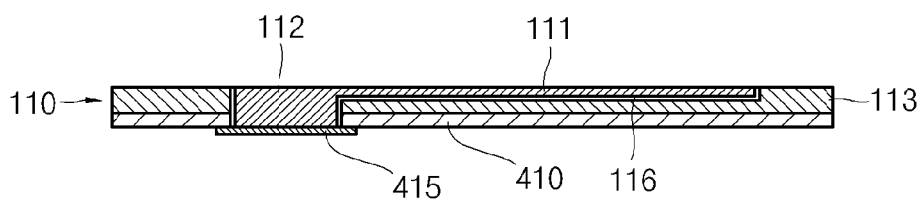

As illustrated in FIG. 9C, a lower under bump metal 415 may be formed on an exposed lower surface of the conductive via 112 by using one method selected from, for example, an electroplating method, an electro-less plating method, a sputtering method, an evaporation method, a chemical vaporization deposition method, or any suitable equivalent. It should be noted, however, that the example methods above do not necessarily represent specific limitations of the present invention, unless recited in the claims, and that other methods may be employed. For example, the lower under bump metal 415 may include nickel (Ni) and gold (Au) which are sequentially plated on the lower surface of the conductive via 112. In addition, the lower under bump metal 415 may extend over a portion of the lower surface of the second dielectric layer 410 located to the side of the lower surface of conductive via 112.

Figure 9D:
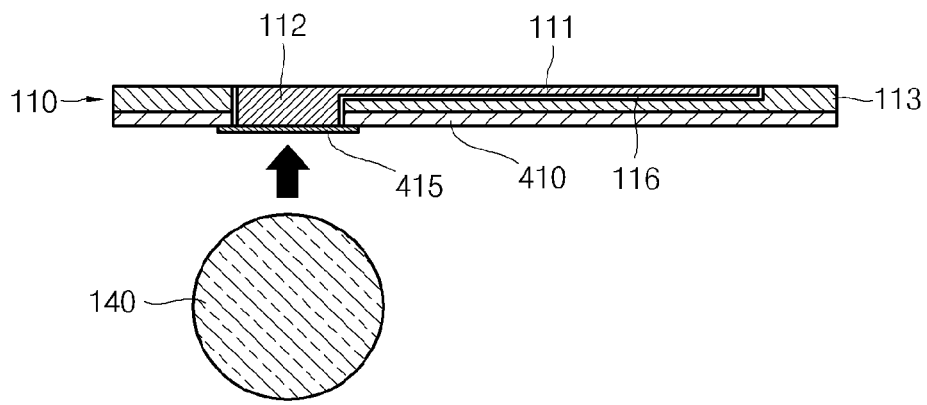

As illustrated in FIG. 9D, a conductive bump 140 may be electrically connected to the lower under bump metal 415. Therefore, the conductive bump 140 is electrically connected to the conductive via 112 through the lower under bump metal 415.

Figure 10A:
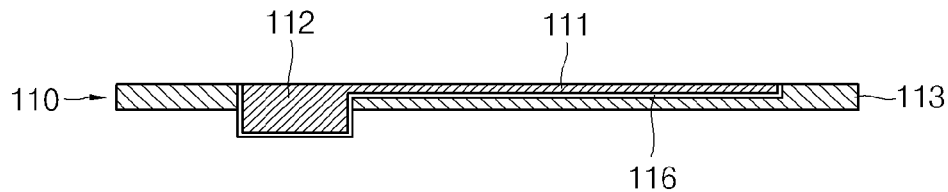
FIGS. 10A to 10D show cross-sectional views illustrating the steps of an exemplary method of manufacturing a semiconductor device, in accordance with a representative embodiment of the present invention.

FIGS. 10A to 10D show cross-sectional views illustrating the steps of an exemplary method of manufacturing a semiconductor device, in accordance with a representative embodiment of the present invention. As illustrated in FIG. 10A, the conductive via 112 protrudes to the outside via the dielectric layer 113 after a dummy substrate such as, for example, the dummy substrate 310 of FIG. 8A, is removed.

Figure 10B:
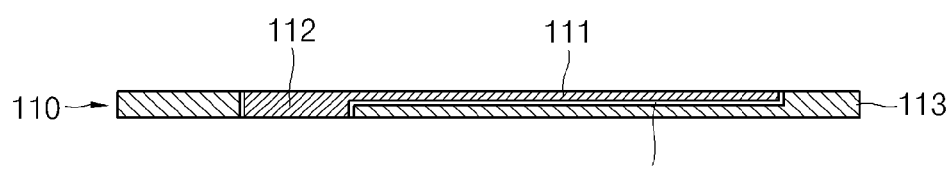

As illustrated in FIG. 10B, the lower surface of the conductive via 112 is flush with the bottom surface of the dielectric layer 113, following the application of a leveling process. In various representative embodiments of the present invention, the leveling process may be, for example, a chemical and/or mechanical planarization process.

Figure 10C:
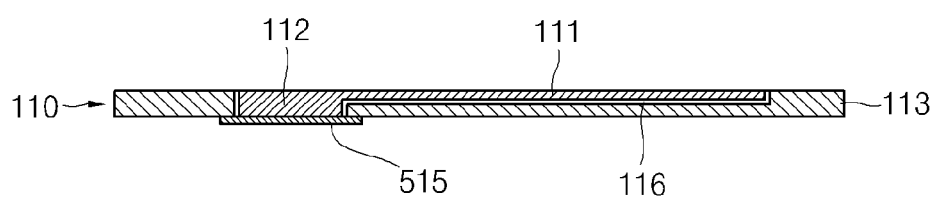

As illustrated in FIG. 10C, a lower under bump metal 515 with predetermined thickness may be formed on the lower surface of the conductive via 112, which is shown in FIG. 10C as being flush with the bottom surface of the dielectric layer 113. In the illustration of FIG. 10C, the lower under bump metal 515 extends over the dielectric layer 113 located at the side of the lower surface of the conductive via 112, in accordance with some representative embodiments of the present invention.

Figure 10D:
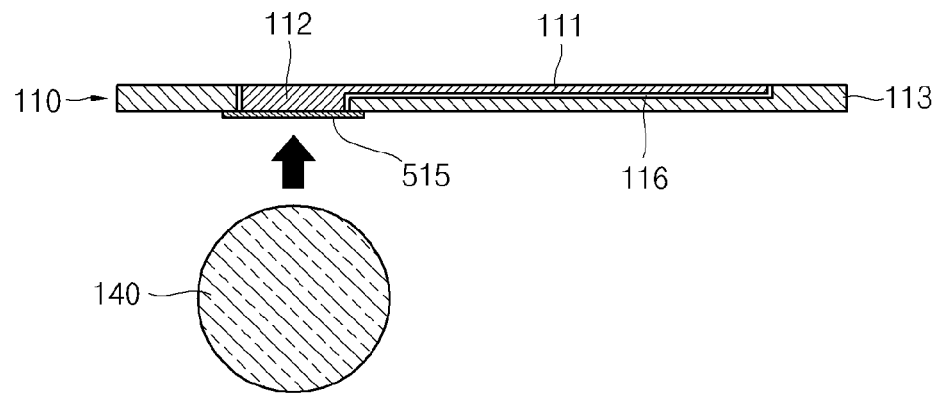

As illustrated in FIG. 10D, in accordance with some representative embodiment of the present invention, a conductive bump 140 may be electrically connected to the lower under bump metal 515.

Figure 11:
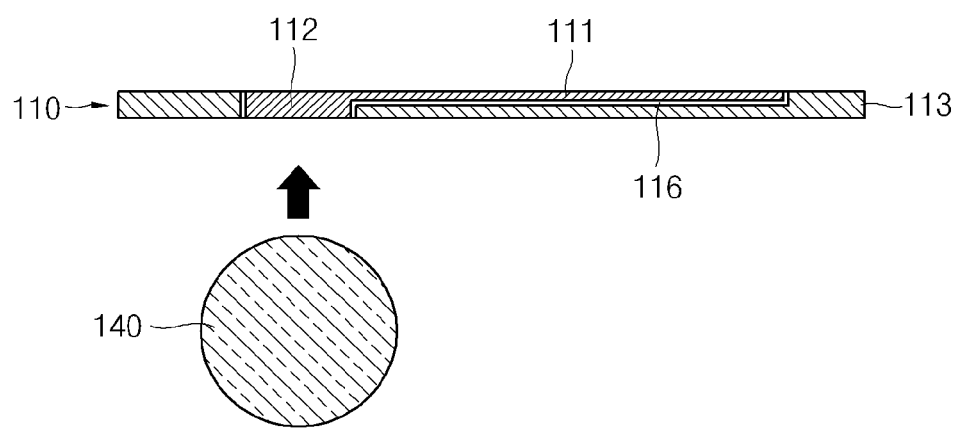
FIG. 11 illustrates cross-sectional views showing a step from an exemplary method of manufacturing a semiconductor device, in accordance with a representative embodiment of the present invention.

FIG. 11 illustrates cross-sectional views showing a step from an exemplary method of manufacturing a semiconductor device, in accordance with a representative embodiment of the present invention.

As illustrated in FIG. 11, in accordance with various representative embodiments of the present invention, a conductive bump 140 may be electrically connected to the lower surface of a conductive via 112 that is flush with the bottom surface of a dielectric layer 113.

An aspect of the present invention provides a semiconductor device and a manufacturing method thereof including a relatively thin interposer excluding a through silicon via.

Another aspect of the present invention provides a semiconductor device having an interposer that includes a dielectric layer having a high dielectric constant on a dummy substrate such as silicon, glass, or suitable equivalents, and a manufacturing method therefor, thereby forming a redistribution layer having minute pitches of a submicron unit, and accomplishing an embedded passive structure.

Another aspect of the present invention provides a semiconductor device including various connection structures between a redistribution layer and one or more bumps, such as a structure excluding an extended or protruding portion, a structure including an extended or protruding portion, a structure including an under bump metal, and manufacturing methods therefor.

According to at least one of embodiments, a manufacturing method of a semiconductor device may include forming an interposer on a dummy substrate. The forming of the interposer may include forming a dielectric layer on the dummy substrate, forming a pattern and a via at the dielectric layer and forming a seed layer on the pattern and the via of the dielectric layer and forming a redistribution layer and a conductive via on the seed layer. A semiconductor die may be connected with the conductive via facing an upper portion of the interposer, and the semiconductor die may be encapsulated with an encapsulant. The dummy substrate may be removed from the interposer, and a bump may be connected with the conductive via facing a lower portion of the interposer.

The dummy substrate may be a silicon substrate or a glass substrate, and the dielectric layer may be a silicon oxide layer, a silicon nitride layer, or an organic layer. The pattern and the via of the dielectric layer may be formed by a laser beam, a photo process, or an etching process. A plurality of redistribution layers may be formed in a horizontal dimension, and an upper surface of the plurality of the redistribution layer may be ground to be electrically separated from each other. The forming steps of the dielectric layer, the seed layer, the redistribution layer, and the conductive via may be repeatedly conducted by 1 to 5 times.

An upper under bump metal may be formed at the conductive via facing the upper portion of the interposer, and the semiconductor die may make an electrical connection with the upper under bump metal. The removing of the dummy substrate may be conducted by grinding and/or etching the dummy substrate to expose the conductive via facing the lower portion of the interposer. The connection of the bump may be conducted by forming a lower under bump metal at the conductive via facing the lower portion of the interposer, and connecting the bump with the lower under bump metal. The conductive via facing the lower portion of the interposer may be disposed at the same plane as a bottom surface of the dielectric layer, and the conductive via facing the lower portion of the interposer may extend or protrude from the bottom surface of the dielectric layer and into the dummy substrate.

The conductive via facing the lower portion of the interposer may extend or protrude from the bottom surface of the dielectric layer, and the lower under bump metal may be formed at an extended region. The seed layer may be formed on the pattern and the via of the dielectric layer, the lower under bump metal may be formed on the seed layer, and the redistribution layer and the conductive via may be formed at the lower under bump metal. The seed layer may be removed, and the lower under bump metal may be exposed or extended through the dielectric layer. The bump may be mounted on a circuit substrate after connecting the bump, and a space between the interposer and the circuit substrate may be filled with underfill. A cover may be attached on the circuit substrate to cover the semiconductor die.

The manufacturing method of a semiconductor device may include forming a second dielectric layer under the conductive via and the dielectric layer; removing a portion of the second dielectric layer corresponding to the conductive via such that a lower surface of the conductive via is exposed to an outside environment via the second dielectric layer; and forming the lower under bump metal on the lower surface of the conductive via that is exposed to the outside environment via the second dielectric layer.

The manufacturing method of a semiconductor device may include leveling the conductive via protruding from the bottom surface of the dielectric layer such that a lower surface of the conductive via is flush with the bottom surface of the dielectric layer; and forming the lower under bump metal on the lower surface of the conductive.

The manufacturing method of a semiconductor device may include leveling the conductive via protruding from the bottom surface of the dielectric layer after removing the dummy substrate such that a lower surface of the conductive via is flush with the bottom surface of the dielectric layer; and forming the lower under bump metal on the lower surface of the conductive via.

According to another embodiment, a semiconductor device may include an interposer having a conductive via, a redistribution layer making a electrical connection with the conductive via, and a dielectric layer passivating the conductive via and the redistribution layer, a semiconductor die connected to a conductive via facing an upper portion of the interposer, an encapsulant encapsulating the semiconductor die and a bump connected to a conductive via facing a lower portion of the interposer. A seed layer may be provided with the conductive via and the redistribution layer, respectively. The dielectric layer may be a silicon oxide layer, a silicon nitride layer or an organic layer. The dielectric layer, the seed layer, the redistribution layer and the conductive via may have a structure of 1 to 5 layers.

An upper under bump metal may be formed at the conductive via facing the upper portion of the interposer, and the semiconductor die may make an electrical connection with the upper under bump metal. A lower under bump metal may be formed at the conductive via facing the lower portion of the interposer, and the bump may be connected with the lower under bump metal. The conductive via facing the lower portion of the interposer may be disposed on the same plane as a bottom surface of the dielectric layer. The conductive via facing the lower portion of the interposer may extend from the bottom surface of the dielectric layer and may be combined with the bump. The conductive via facing the lower portion of the interposer may extend from the bottom surface of the dielectric layer, the lower under bump metal may be formed at an extended region, and the bump may be combined with the lower under bump metal. The bump may be installed on a circuit substrate, a space between the interposer and the circuit substrate may be filled with an underfill, and a cover may be attached at the circuit substrate to cover the semiconductor die.

The redistribution layer may include a first redistribution layer and a second redistribution layer, separated from each other, and the device may include a metal-insulator-metal (MIM) structure including a dielectric layer interposed between the first and second redistribution layers. A second dielectric layer may be formed on a bottom surface of the dielectric layer.

According to an embodiment, a semiconductor device including a relatively thin interposer excluding a through silicon via and a manufacturing method thereof are provided. According to an embodiment, a semiconductor device having an interposer including a dielectric layer having a high dielectric constant on a dummy substrate such as silicon or glass, and a manufacturing method thereof are provided. A redistribution layer having minute pitches of a submicron unit may be possibly formed, and an embedded passive structure may be accomplished.

According to an embodiment, a semiconductor device including various connection structures between a redistribution layer and a bump, such as a structure excluding an extruded portion, a structure including an extruded portion, a structure including an under bump metal, and a manufacturing method thereof are provided.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present disclosure as set forth in the following claims.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method of manufacturing a semiconductor device, the method comprising:
   electrically connecting a semiconductor die to an interposer that comprises:
      an upper surface at which the semiconductor die is attached;
      a dielectric layer on a dummy substrate;
      a conductive via in a via hole of the dielectric layer; and
      a redistribution layer along a portion of the dielectric layer and electrically connected to the conductive via;
   encapsulating at least a portion of the semiconductor die with an encapsulating material;
   removing the dummy substrate from the interposer; and
   after said removing, electrically connecting a conductive interconnection structure to the conductive via at a lower surface of the interposer.

2. The manufacturing method of claim 1, comprising:
   attaching the interconnection structure to a substrate;
   forming a first filler material between the semiconductor die and the interposer;
   forming a second filler material between the interposer and the substrate, wherein the second filler material covers a bottom surface and at least one side surface of the interposer.

3. The manufacturing method of claim 2, comprising forming a planar side surface of the first filler material that is coplanar with the at least one side surface of the interposer.

4. The manufacturing method of claim 3, wherein at least one of the first filler material and the second filler material comprises encapsulant.

5. The manufacturing method of claim 1, wherein the dummy substrate comprises a silicon or glass substrate.

6. The manufacturing method of claim 1, wherein the interposer is a product of a semiconductor wafer fabrication process.

7. The manufacturing method of claim 1, wherein said removing the dummy substrate from the interposer comprises one or both of grinding and/or etching the dummy substrate.

8. A semiconductor device comprising:
an interposer comprising a dielectric layer, a first conductive via through the dielectric layer, and a redistribution layer making an electrical connection with the conductive via, wherein the dielectric layer passivates the first conductive via and the redistribution layer;
a semiconductor die connected to the first conductive via and located at a top surface of the interposer;
an encapsulating material encapsulating a bottom surface of the semiconductor die, the bottom surface of the semiconductor die facing the top surface of the interposer, wherein at least one surface of the semiconductor die is not encapsulated by the encapsulating material; and
a conductive bump connected to a second conductive via passing through a second dielectric layer at a bottom surface of the interposer.

9. The semiconductor device of claim 8, wherein:
the encapsulating material comprises at least one of an encapsulant and/or an underfill; and
the interposer comprises the second dielectric layer and the conductive via.

10. The semiconductor device of claim 8, comprising a package substrate attached to the conductive bump.

11. The semiconductor device of claim 10, comprising:
a filler material between the interposer and the substrate, wherein the filler material contacts a side surface of the interposer.

12. The semiconductor device of claim 11, wherein the filler material contacts the encapsulating material at a planar side surface of the encapsulating material.

13. A semiconductor device comprising:
a substrate;
an interposer coupled to the substrate, said interposer comprising:
a lower interposer surface facing the substrate, an upper interposer surface, and interposer side surfaces;
a dielectric layer;
a first conductive via extending through the dielectric layer; and
a redistribution layer electrically connected to the first conductive via;
a semiconductor die electrically connected to the conductive via and comprising a lower die surface facing the upper interposer surface;
a first filler material between the semiconductor die and the interposer; and
a second filler material between the interposer and the substrate, wherein the second filler material completely covers at least one of the interposer side surfaces.

14. The semiconductor device of claim 13, wherein the first filler material comprises at least one of an encapsulant and/or an underfill.

15. The semiconductor device of claim 13, wherein the second filler material comprises an encapsulant.

16. The semiconductor device of claim 13, wherein the first filler material comprises a planar side surface that is coplanar with a respective one of the interposer side surfaces.

17. The semiconductor device of claim 16, wherein the second filter material contacts the planar side surface of the first filler material.

18. The semiconductor device of claim 13, wherein at least one surface of the semiconductor die is free of encapsulant.

19. The semiconductor device of claim 13, wherein the interposer is formed in a semiconductor wafer fabrication process.

20. The semiconductor device of claim 13, wherein:
the interposer comprises:
a second dielectric layer; and
a second conductive via extending through the second dielectric layer and electrically connected to the redistribution layer,
and the semiconductor device further comprises:
a copper pillar electrically coupling the semiconductor die to the first conductive via; and
a conductive bump coupled to the second conductive via.

* * * * *